United States Patent
Niskanen et al.

(10) Patent No.: US 11,062,914 B2
(45) Date of Patent: Jul. 13, 2021

(54) REMOVAL OF SURFACE PASSIVATION

(71) Applicant: ASM IP HOLDING B.V., Almere (NL)

(72) Inventors: Antti Juhani Niskanen, Helsinki (FI); Jaakko Anttila, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 16/987,990

(22) Filed: Aug. 7, 2020

(65) Prior Publication Data

US 2020/0365416 A1     Nov. 19, 2020

Related U.S. Application Data

(63) Continuation of application No. 16/143,888, filed on Sep. 27, 2018, now Pat. No. 10,741,411, which is a
(Continued)

(51) Int. Cl.
*H01L 21/3213* (2006.01)
*H01L 21/02* (2006.01)
(Continued)

(52) U.S. Cl.
CPC .. *H01L 21/32135* (2013.01); *H01L 21/02074* (2013.01); *H01L 21/02225* (2013.01);
(Continued)

(58) Field of Classification Search
CPC ......... H01L 21/02225; H01L 21/02334; H01L 21/30621; H01L 21/31055;
(Continued)

(56) References Cited

U.S. PATENT DOCUMENTS

| 4,804,640 A | 2/1989 | Kaganowicz |
| 4,863,879 A | 9/1989 | Kwok |

(Continued)

FOREIGN PATENT DOCUMENTS

| EP | 0469456 A1 | 2/1992 |
| EP | 0880168 A2 | 11/1998 |

(Continued)

OTHER PUBLICATIONS

Aaltonen et al., "Atomic Layer Deposition of Iridium Thin Films", Journal of the Electrochemical Society, 151 (8) G489-G492 (2004).
(Continued)

*Primary Examiner* — Binh X Tran
(74) *Attorney, Agent, or Firm* — Knobbe, Martens, Olson & Bear LLP

(57) ABSTRACT

Methods for removing a passivation film from a copper surface can include exposing the passivation film to a vapor phase organic reactant, for example at a temperature of 100° C. to 400° C. In some embodiments, the passivation film may have been formed by exposure of the copper surface to benzotriazole, such as can occur during a chemical mechanical planarization process. The methods can be performed as part of a process for integrated circuit fabrication. A second material can be selectively deposited on the cleaned copper surface relative to another surface of the substrate.

20 Claims, 2 Drawing Sheets

Related U.S. Application Data continuation of application No. 15/331,366, filed on Oct. 21, 2016, now Pat. No. 10,115,603, which is a continuation of application No. 14/628,799, filed on Feb. 23, 2015, now Pat. No. 9,490,145.

(51) Int. Cl.
   *H01L 21/311* (2006.01)
   *H01L 21/768* (2006.01)
   *H01L 21/306* (2006.01)

(52) U.S. Cl.
   CPC .. *H01L 21/02334* (2013.01); *H01L 21/02337* (2013.01); *H01L 21/30621* (2013.01); *H01L 21/31111* (2013.01); *H01L 21/32136* (2013.01); *H01L 21/76883* (2013.01); *H01L 21/76849* (2013.01)

(58) Field of Classification Search
   CPC ......... H01L 21/32135; H01L 21/02337; H01L 21/32136
   USPC ................. 438/697, 699, 704, 706
   See application file for complete search history.

(56) References Cited

U.S. PATENT DOCUMENTS

| | | |
|---|---|---|
| 4,948,755 A | 8/1990 | Mo |
| 5,288,697 A | 2/1994 | Schrepp et al. |
| 5,447,887 A | 9/1995 | Filipiak et al. |
| 5,604,153 A | 2/1997 | Tsubouchi et al. |
| 5,633,036 A | 5/1997 | Seebauer et al. |
| 5,869,135 A | 2/1999 | Vaeth et al. |
| 5,925,494 A | 7/1999 | Horn |
| 6,046,108 A | 4/2000 | Liu et al. |
| 6,416,577 B1 | 7/2002 | Suntoloa et al. |
| 6,426,015 B1 | 7/2002 | Xia et al. |
| 6,455,414 B1 | 9/2002 | Hillman et al. |
| 6,482,740 B2 | 11/2002 | Soininen et al. |
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton |
| 6,844,258 B1 | 1/2005 | Fair et al. |
| 6,852,635 B2 | 2/2005 | Satta et al. |
| 6,858,533 B2 | 2/2005 | Chu et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,041,609 B2 | 5/2006 | Vaartstra |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,611,751 B2 | 11/2009 | Elers |
| 7,695,567 B2 | 4/2010 | Fu |
| 7,754,621 B2 | 7/2010 | Putkonen |
| 7,790,631 B2 | 9/2010 | Sharma et al. |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Raaijmakers |
| 7,951,637 B2 | 5/2011 | Weidman et al. |
| 7,955,979 B2 | 6/2011 | Kostamo et al. |
| 7,964,505 B2 | 6/2011 | Khandelwal et al. |
| 8,173,554 B2 | 5/2012 | Lee et al. |
| 8,293,597 B2 | 10/2012 | Raaijmakers |
| 8,293,658 B2 | 10/2012 | Shero et al. |
| 8,425,739 B1 | 4/2013 | Wieting |
| 8,466,052 B2 | 6/2013 | Baek et al. |
| 8,536,058 B2 | 9/2013 | Kostamo et al. |
| 8,623,468 B2 | 1/2014 | Lin et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Korbrinsky M et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,312,131 B2 | 4/2016 | Bauer et al. |
| 9,349,687 B1 | 5/2016 | Gates et al. |
| 9,455,138 B1 | 9/2016 | Fukazawa et al. |
| 9,490,145 B2 * | 11/2016 | Niskanen .......... H01L 21/32135 |
| 9,502,289 B2 | 11/2016 | Haukka et al. |
| 9,552,979 B2 | 1/2017 | Knaepen et al. |
| 9,679,808 B2 | 6/2017 | Haukka et al. |
| 9,786,491 B2 | 10/2017 | Suzuki et al. |
| 9,786,492 B2 | 10/2017 | Suzuki et al. |
| 9,803,277 B1 | 10/2017 | Longrie et al. |
| 9,805,974 B1 | 10/2017 | Chen et al. |
| 9,816,180 B2 | 11/2017 | Haukka et al. |
| 9,895,715 B2 | 2/2018 | Haukka et al. |
| 9,911,595 B1 | 3/2018 | Smith et al. |
| 10,014,212 B2 | 7/2018 | Chen et al. |
| 10,041,166 B2 | 8/2018 | Longrie et al. |
| 10,047,435 B2 | 8/2018 | Haukka et al. |
| 10,049,924 B2 | 8/2018 | Haukka et al. |
| 10,115,603 B2 * | 10/2018 | Niskanen .......... H01L 21/02337 |
| 10,157,786 B2 | 12/2018 | Haukka et al. |
| 10,186,420 B2 | 1/2019 | Fukazawa |
| 10,204,782 B2 | 2/2019 | Maes et al. |
| 10,343,186 B2 | 7/2019 | Pore et al. |
| 10,373,820 B2 | 8/2019 | Tois et al. |
| 10,428,421 B2 | 10/2019 | Haukka et al. |
| 10,443,123 B2 | 10/2019 | Haukka et al. |
| 10,453,701 B2 | 10/2019 | Tois et al. |
| 10,480,064 B2 | 11/2019 | Longrie et al. |
| 10,546,741 B2 | 1/2020 | Murakami et al. |
| 10,695,794 B2 | 6/2020 | Pore et al. |
| 10,741,411 B2 * | 8/2020 | Niskanen .......... H01L 21/02074 |
| 10,847,363 B2 | 11/2020 | Tapily |
| 10,900,120 B2 | 1/2021 | Sharma et al. |
| 2001/0019803 A1 | 9/2001 | Mirkanimi |
| 2001/0021414 A1 | 9/2001 | Morishima et al. |
| 2001/0025205 A1 | 9/2001 | Chern et al. |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0176559 A1 | 9/2003 | Bice et al. |
| 2003/0181035 A1 | 9/2003 | Yoon et al. |
| 2003/0185997 A1 | 10/2003 | Hsieh |
| 2003/0192090 P1 | 10/2003 | Meilland |
| 2003/0193090 A1 | 10/2003 | Otani et al. |
| 2004/0092073 A1 | 5/2004 | Cabral |
| 2004/0129558 A1 | 7/2004 | Liu et al. |
| 2004/0219746 A1 | 11/2004 | Vaartstra et al. |
| 2005/0012975 A1 | 1/2005 | George et al. |
| 2005/0136604 A1 | 6/2005 | Al-Bayati et al. |
| 2005/0160575 A1 | 7/2005 | Gambino et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0121271 A1 | 6/2006 | Frey et al. |
| 2006/0121677 A1 | 6/2006 | Parekh et al. |
| 2006/0121733 A1 | 6/2006 | Kilpela et al. |

(56) References Cited

U.S. PATENT DOCUMENTS

| | | |
|---|---|---|
| 2006/0128150 A1 | 6/2006 | Gandikota et al. |
| 2006/0141155 A1 | 6/2006 | Gordon et al. |
| 2006/0156979 A1 | 7/2006 | Thakur et al. |
| 2006/0176559 A1 | 8/2006 | Minoda et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0063317 A1 | 3/2007 | Kim et al. |
| 2007/0098894 A1 | 5/2007 | Verghese et al. |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1* | 12/2007 | Dordi ............ C23C 18/1851 427/99.5 |
| 2008/0066680 A1 | 3/2008 | Sherman |
| 2008/0072819 A1 | 3/2008 | Rahtu |
| 2008/0124932 A1* | 5/2008 | Tateishi ........... H01L 21/02074 438/692 |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2010/0314765 A1 | 12/2010 | Liang et al. |
| 2011/0039420 A1 | 2/2011 | Nakao |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0198756 A1 | 8/2011 | Thenappan et al. |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0091541 A1 | 4/2012 | Suchomel et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0084700 A1 | 4/2013 | Swerts et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1 | 6/2013 | Vaidya et al. |
| 2013/0189790 A1 | 7/2013 | Li et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0252487 A1 | 9/2014 | Stephens et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004317 A1 | 1/2015 | Dussarrat et al. |
| 2015/0004319 A1 | 1/2015 | Mizue |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1 | 8/2015 | Haukka et al. |
| 2015/0240121 A1 | 8/2015 | Sugita et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0372205 A1 | 12/2015 | Kimura et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0152640 A1 | 6/2016 | Kuchenbeiser et al. |
| 2016/0172189 A1 | 6/2016 | Tapily |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293384 A1 | 10/2016 | Yan et al. |
| 2016/0293398 A1 | 10/2016 | Danek et al. |
| 2016/0315191 A1 | 10/2016 | Tsai et al. |
| 2016/0346838 A1* | 12/2016 | Fujita ..................... C09D 7/67 |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0051405 A1 | 2/2017 | Fukazawa et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0332179 A1 | 11/2017 | Bright et al. |
| 2017/0352533 A1 | 12/2017 | Tois et al. |
| 2017/0352550 A1 | 12/2017 | Tois et al. |
| 2017/0358482 A1 | 12/2017 | Chen et al. |
| 2018/0040708 A1 | 2/2018 | Narayanan et al. |
| 2018/0080121 A1 | 3/2018 | Longrie et al. |
| 2018/0096888 A1 | 4/2018 | Naik et al. |

(56) References Cited

U.S. PATENT DOCUMENTS

| | | | |
|---|---|---|---|
| 2018/0142348 A1 | 5/2018 | Yu et al. |
| 2018/0151355 A1 | 5/2018 | Fukazawa |
| 2018/0182618 A1 | 6/2018 | Blanquart et al. |
| 2018/0222933 A1 | 8/2018 | Romero |
| 2018/0233350 A1 | 8/2018 | Tois et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0155159 A1 | 5/2019 | Knaepen et al. |
| 2019/0283077 A1 | 9/2019 | Pore et al. |
| 2019/0333761 A1 | 10/2019 | Tois et al. |
| 2019/0341245 A1 | 11/2019 | Tois et al. |
| 2020/0051829 A1 | 2/2020 | Tois et al. |

FOREIGN PATENT DOCUMENTS

| | | |
|---|---|---|
| EP | 1340269 | 2/2009 |
| JP | 2001127068 | 5/2001 |
| JP | 2008311603 | 12/2008 |
| JP | 2011018742 | 1/2011 |
| JP | 2011-187583 | 9/2011 |
| JP | 2014-93331 | 5/2014 |
| KR | 102001001072 | 2/2001 |
| KR | 1020020010821 | 2/2002 |
| KR | 20030027392 | 4/2003 |
| KR | 1020040056026 | 6/2004 |
| KR | 1020050103811 | 11/2005 |
| KR | 10-0920033 | 10/2009 |
| TW | 2005-39321 | 12/2005 |
| TW | 2010-05827 | 2/2010 |
| TW | 2014-39365 | 10/2014 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2016/178978 | 11/2016 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.
Benzotriazole, Wikipedia via https://en.wikipedia.org/wiki/Benzotriazole; pp. 1-5, no date available.
Bernal-Ramos, et al., "Atomic Layer Deposition of Cobalt Silicide Thin Films Studied by in Situ Infrared Spectroscopy", Chem. Mater. 2015, 27, pp. 4943-4949.
Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.
Burton, B.B. et al., "Atomic Layer Deposition of MgO Using Bis(ethylcyclopentadienyl)magnesium and H20". J. Phys. Chem. C, 2009, 113, 1939-1946.
Burton, B.B., et al., "Si02 Atomic Layer Deposition Using Tris(dimethylamino)silane and Hydrogen Peroxide Studied by in Situ Transmission FTIR Spectroscopy". J. Phys. Chem. C, 2009, 113, 8249-8257.
Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.
Chen et al., Highly Stable Monolayer Resists for Atomic Layer Deposition on Germanium and Silicon, Chem. Matter, vol. 18, No. 16, pp. 3733-3741, 2006.
Cho et al., "Atomic layer deposition of Al2O3 thin films using dimethylaluminum isopropoxide and water", Journal of Vacuum Science & Technology A 21, (2003), doi: 10.1116/1.1562184, pp. 1366-1370.
Coclite, et al.; 25th Anniversary Article: CVD Polymers: A New Paradigm for Surface Modification and Device Fabrication; Advanced Materials; Oct. 2013; 25; pp. 5392-5423.
Elam et al., "Kinetics of the WF6 and Si2H6 surface reactions during tungsten atomic layer deposition", Surface Science, vol. 479, 2001, pp. 121-135.
Elam et al. "Nucleation and growth during tungsten atomic layer deposition on SiO2 surfaces", Thin Solid Films, vol. 386, 2001 pp. 41-52.
Ellinger et al., "Selective Area Spatial Atomic Layer Deposition of ZnO, Al2O3, and Aluminum-Doped ZnO Using Poly(vinyl pyrolidone)", Chem. Mater. 2014, 26, pp. 1514-1522.
Fabreguette et al., Quartz crystal microbalance study of tungsten atomic layer deposition using WF6 and Si2H6, Thin Solid Films, vol. 488, 2005, pp. 103-110.
Farm et al. Selective-Area Atomic Layer Deposition Using Poly(methyl methacrylate) Films as Mask Layers, J. Phys. Chem. C, 2008, 112, pp. 15791-15795. (Year: 2008).
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.
U.S. Appl. No. 14/612,784, filed Feb. 3, 2015.
U.S. Appl. No. 15/877,632, filed Jan. 23, 2018.
U.S. Appl. No. 16/657,307, filed Oct. 18, 2019.
U.S. Appl. No. 14/687,833, filed Apr. 15, 2015.
U.S. Appl. No. 16/100,855, filed Aug. 10, 2018.
U.S. Appl. No. 16/594,365, filed Oct. 7, 2019.
U.S. Appl. No. 14/628,799, filed Feb. 23, 2015.
U.S. Appl. No. 15/331,366, filed Oct. 21, 2016.
U.S. Appl. No. 16/143,888, filed Sep. 27, 2018.
U.S. Appl. No. 14/817,161, filed Aug. 3, 2015.
U.S. Appl. No. 14/819,274, filed Aug. 5, 2015.
U.S. Appl. No. 16/787,672, filed Feb. 11, 2020.
U.S. Appl. No. 15/432,263, filed Feb. 14, 2017.
U.S. Appl. No. 16/158,780, filed Oct. 12, 2018.
U.S. Appl. No. 16/773,064, filed Jan. 27, 2020.
U.S. Appl. No. 15/221,453, filed Jul. 27, 2016.
U.S. Appl. No. 16/575,112, filed Sep. 18, 2019.
U.S. Appl. No. 15/177,195, filed Jun. 8, 2016.
U.S. Appl. No. 15/795,768, filed Oct. 27, 2017.
U.S. Appl. No. 16/040,844, filed Jul. 20, 2018.
U.S. Appl. No. 16/676,017, filed Nov. 6, 2019.
U.S. Appl. No. 15/581,726, filed Apr. 28, 2017.
U.S. Appl. No. 15/364,024, filed Nov. 29, 2016.
U.S. Appl. No. 15/892,728, filed Feb. 9, 2018.
U.S. Appl. No. 16/605,475, filed Oct. 15, 2019.
U.S. Appl. No. 16/033,952, filed Jul. 12, 2018.
U.S. Appl. No. 16/399,328, filed Apr. 30, 2019.
U.S. Appl. No. 15/971,601, filed May 4, 2018.
U.S. Appl. No. 16/588,600, filed Sep. 30, 2019.
U.S. Appl. No. 16/836,151, filed Mar. 31, 2020.
U.S. Appl. No. 13/708,863, filed Dec. 7, 2012.
U.S. Appl. No. 14/737,293, filed Jun. 11, 2015.
U.S. Appl. No. 15/356,306, filed Nov. 18, 2016.
U.S. Appl. No. 16/213,479, filed Dec. 7, 2018.
U.S. Appl. No. 13/702,992, filed Mar. 26, 2013.
U.S. Appl. No. 14/613,183, filed Feb. 3, 2015.
U.S. Appl. No. 14/988,374, filed Jan. 5, 2016.

(56) References Cited

OTHER PUBLICATIONS

U.S. Appl. No. 15/609,497, filed May 31, 2017.
U.S. Appl. No. 16/100,581, filed Aug. 10, 2018.
Formic Acid, Wikipedia via https://en.wikipedia.org/wiki/Formic_acid; pp. 1-5, no date available.
George, Steven M., "Atomic Layer Deposition: An Overview", Chem. Rev. 2010, 110, pp. 111-113.
Ghosal et al., Controlling Atomic Layer Deposition of TiO2 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
International Search Report and Written Opinion dated Feb. 17, 2012 in Application No. PCT/US2011/039970, filed Jun. 10, 2011.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Lee et al., Area-Selective Atomic Layer Deposition Using Self-Assembled Monolayer and Scanning Probe Lithography, Journal of the Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-116102-3, 2010.
Mackus et al., "The use of atomic layer deposition in advanced nanopatterning", Nanoscale, 2014, 6, pp. 10941-10960.
Maluf et al., "Selective tungsten filling of sub-0.25 μm trenches for the fabrication of scaled contacts and x-ray masks", J. Vac. Sci. Technol. B, vol. 8, No. 3, May/Jun. 1990, pp. 568-569.
Norrman, et al.; 6 Studies of Spin-Coated Polymer Films; Annu. Rep. Prag. Chem.; Sect. C; 2005; 101; pp. 174-201.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, 29, Mar. 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Schuiskly et al., "Atomic Layer Deposition of Thin Films Using O2 as Oxygen Source", Langmuir, vol. 17, No. 18, 2001, pp. 5508-5512.
Sundberg, et al.; Organic and Inorganic-Organic Thin Film Structures by Molecular Layer Deposition: A Review; Beilstein J. Nanotechnol; 2014, 5, pp. 1104-1136.
Suntola, Tuomo, "Thin Films and Epitaxy Part B: Grown mechanism and Dynamics", Handbook of Crystal Growth vol. 3, Elsevier, 1994, 33 pages.
Ting, et al., "Selective Electroless Metal Deposition for Integrated Circuit Fabrication", J. Electrochem. Soc., vol. 136, No. 2, Feb. 1989, pp. 456-462.
Toirov, et al.; Thermal Cyclodehydration of Polyamic Acid Initiated by UV-Irradiation; Iranian Polymer Journal; vol. 5, No. 1; pp. 1A323:C3286-22; 1996; Iran.

(56) References Cited

OTHER PUBLICATIONS

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

Yu et al. "Gas/surface reactions in the chemical vapor deposition of tungsten using WF6/SiH4 mixtures", J. Vac. Sci. Technol. A, vol. 7, No. 3, May/Jun. 1989, pp. 625-629.

Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.

Vervuurt et al., "Area-selective atomic layer deposition of platinum using photosensitive polyimide", Nanotechnology 27, 2016, in 6 pages.

Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.

U.S. Appl. No. 17/135,001, filed Dec. 28, 2020.

U.S. Appl. No. 17/113,383, filed Dec. 7, 2020.

U.S. Appl. No. 17/064,865, filed Oct. 7, 2020.

Hu et al. "Coating strategies for atomic layer deposition", Nanotechnol. Rev. 2017; 6(6): pp. 527-547.

Lin et al., "Selective Deposition of Multiple Sensing Materials on Si Nanobelt Devices through Plasma-Enhanced Chemical Vapor Deposition and Device-Localized Joule Heating", ACS Appl. Mater. Interfaces 2017, 9, 39935-39939, DOI: 10.1021/acsami.7b13896.

Wang et al., "Low-temperature plasma-enhanced atomic layer deposition of tin oxide electron selective layers for highly efficient planar perovskite solar cells", Journal of Materials Chemistry A, 2016, 4, pp. 12080-12087.

\* cited by examiner

REMOVAL OF SURFACE PASSIVATION

REFERENCE TO RELATED APPLICATION

The present application is a continuation of U.S. application Ser. No. 16/143,888, filed Sep. 27, 2018, which is a continuation of U.S. application Ser. No. 15/331,366, filed Oct. 21, 2016, now U.S. Pat. No. 10,115,603, which is a continuation of U.S. application Ser. No. 14/628,799, filed Feb. 23, 2015, now U.S. Pat. No. 9,490,145, each of which is hereby incorporated by reference in its entirety.

BACKGROUND

Field

The present disclosure relates generally to the field of semiconductor device manufacturing and, more particularly, to removal of surface passivation such as from a copper layer following chemical mechanical planarization processes.

Description of the Related Art

Electrical interconnects in electronic devices often comprise copper (Cu), due to the resistivity, frequency capability, power requirement and/or electromigration performances of copper. For example, three-dimensional structures can be formed in dielectric material on a substrate surface (e.g., trench and/or via structures). Copper can be subsequently deposited over and/or within the three-dimensional structures to form the desired electrical interconnects.

Chemical mechanical planarization (CMP) is typically used for etching back excess copper on a substrate surface, as patterning of copper using reactive ion etching (RIE) may be challenging due to difficulty in the formation of volatile copper-containing byproducts. Chemical mechanical planarization can be used to remove excess copper from the substrate surface (e.g., copper deposited over the substrate surface for forming electrical interconnects) and/or to planarize copper on the substrate surface to prepare the substrate surface for subsequent processing. Chemical mechanical planarization can utilize a combination of chemical and mechanical forces in its removal of material from the substrate surface. For example, chemical mechanical planarization typically uses a polishing pad to apply a slurry solution to a substrate surface for etch back and planarization of the substrate surface. However, exposure of copper to the slurry solution during the chemical mechanical planarization process may result in formation of a passivation film on the substrate surface over the copper. While the passivation film may prevent oxidation of the underlying copper, for example due to exposure of the copper to oxygen-containing ambient during transport of the substrate during processing, the passivation film may undesirably modify one or more characteristics of the substrate surface for subsequent processing.

Use of a plasma process in removal of the passivation film may undesirably modify one or more characteristics of the copper surface. Plasma processes may damage the copper surface, generate contaminants within the reaction space, and/or undesirably modify surface characteristics of one or more other materials on the substrate surface (e.g., a dielectric material, such as a low-k dielectric material). Controlled exposure of the substrate surface to reactants in removal processes that utilize liquid phase reactants may be difficult. Use of liquid phase reactants may also contribute to reduced throughput, for example due to an additional drying process that is required after removal of the passivation material. Additionally, liquid phase reactants may undesirably penetrate pores of porous low-k materials, contributing to degradation of the low-k materials.

Therefore, a continued need exists for improved methods of removing surface passivation material formed over copper.

SUMMARY

In some aspects, methods for removing passivation material from a substrate are provided. In some embodiments, methods for removing a passivation film from a substrate can include providing a substrate including the passivation film on a metal surface. The passivation film may have been formed by exposure of the metal surface to a passivation agent including a hydrocarbon. The passivation film is exposed to a vapor phase organic reactant, for example at a temperature of about 100° C. to about 400° C. In some embodiments, the passivation film is not exposed to a plasma during exposure of the passivation film to the vapor phase organic reactant.

In some embodiments, the metal surface is a copper surface. In some embodiments, the substrate can include a dielectric material, and a surface chemistry of the dielectric material is substantially unaffected by exposing the passivation film to the vapor phase organic reactant. In some embodiments, exposing the passivation film to the vapor phase organic reactant can be repeated at least 10 times.

In some embodiments, methods of removing a passivation film from a substrate surface can include exposing the passivation film to a vapor phase organic reactant that includes carboxylic acid. In some embodiments, the vapor phase organic reactant can include formic acid. In some embodiments, the passivation agent can include an aromatic hydrocarbon. In some embodiments, the passivation agent that forms the passivation film can include benzotriazole.

In some aspects, methods for integrated circuit fabrication are provided. Methods for integrated circuit fabrication can include providing a substrate including a passivation film on a copper surface. The passivation film may have been formed by subjecting a copper surface of the substrate to a chemical mechanical planarization process. A cleaning process can be carried out for removing the passivation film from the copper surface. Performing the cleaning process can include contacting the passivation film with a vapor phase organic reactant, for example at a process temperature of about 100° C. to about 400° C. In some embodiments the vapor phase organic reactant has the formula R—COOH, the R being a hydrogen, or a C1-C3 alkyl. The vapor phase organic reactant may be formic acid. In some embodiments the cleaning process is substantially free of plasma activated reactants. In some embodiments, the process temperature is about 200° C. to about 250° C.

In some embodiments, the chemical mechanical planarization process can include exposing the copper surface to a passivation agent to form the passivation film, where the passivation agent can include benzotriazole.

In some embodiments, the substrate can include a dielectric material, and a surface chemistry of the dielectric material may be substantially unaffected by the cleaning process.

In some aspects, methods of integrated circuit fabrication can include cleaning a copper surface of a substrate by removing a passivation film that was formed on the copper surface by exposure to a hydrocarbon passivation agent.

Cleaning can include contacting the passivation film with a vapor phase organic reactant substantially without exposing the substrate to a plasma. A second material can be selectively deposited on the cleaned copper surface relative to a second surface on the substrate. The passivation film may be removed at a process temperature of about 100° C. to about 400° C.

In some embodiments, the passivation film can include a coordination complex formed by the copper and the passivation agent. In some embodiments, the passivation agent can include benzotriazole and the vapor phase organic reactant can include a carboxylic acid.

In some embodiments, the second material can include an electrically conductive material. For example, the second material can include tungsten. In some embodiments, the second material can include an electrically insulating material. In some embodiments, the second surface can include a dielectric material, and the second material is selectively deposited on the cleaned surface relative to the dielectric material. In some embodiments the second material is substantially not deposited on the dielectric material.

For purposes of summarizing the invention and the advantages achieved over the prior art, certain objects and advantages are described herein. Of course, it is to be understood that not necessarily all such objects or advantages need to be achieved in accordance with any particular embodiment. Thus, for example, those skilled in the art will recognize that the invention may be embodied or carried out in a manner that can achieve or optimize one advantage or a group of advantages without necessarily achieving other objects or advantages.

All of these embodiments are intended to be within the scope of the invention herein disclosed. These and other embodiments will become readily apparent to those skilled in the art from the following detailed description having reference to the attached figures, the invention not being limited to any particular disclosed embodiment(s).

BRIEF DESCRIPTION OF THE DRAWINGS

These and other features, aspects, and advantages of the present disclosure are described with reference to the drawings of certain embodiments, which are intended to illustrate certain embodiments and not to limit the invention.

DETAILED DESCRIPTION

Figure 1:
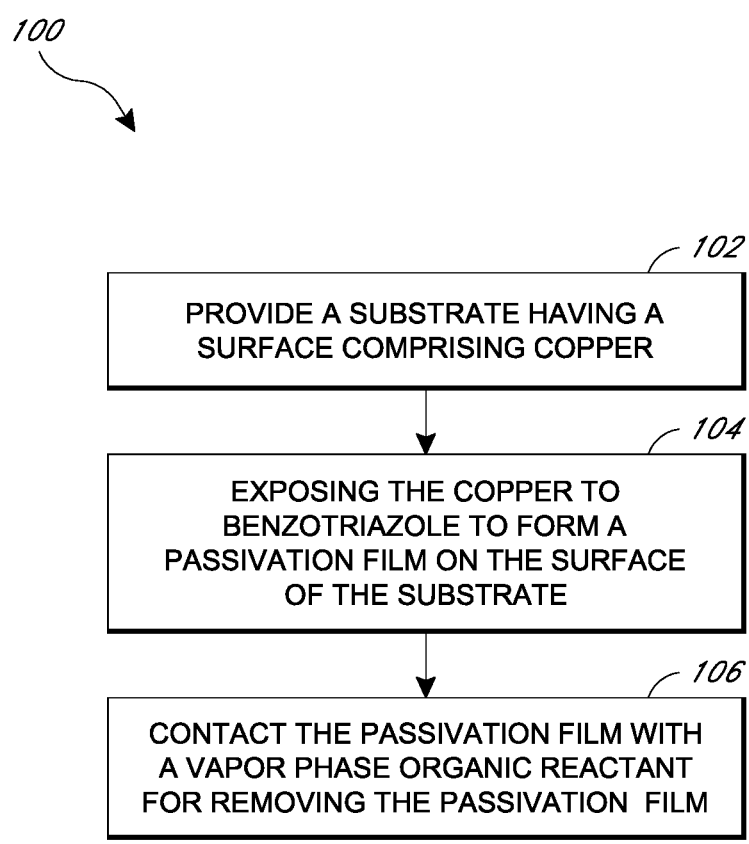
FIG. 1 shows an example of a substrate surface cleaning process for removing a passivation film formed over a copper layer.

Although certain embodiments and examples are described below, those of skill in the art will appreciate that the invention extends beyond the specifically disclosed embodiments and/or uses and obvious modifications and equivalents thereof. Thus, it is intended that the scope of the invention herein disclosed should not be limited by any particular embodiments described below.

In some embodiments, methods are provided for removing a passivation material from a substrate. In some embodiments a substrate is provided comprising a passivation film on a metal surface, such as a copper (Cu) surface, a nickel (Ni) surface, or a cobalt (Co) surface. In some embodiments, a passivation film may be formed or have previously been formed on a copper-containing surface, a nickel-containing surface, or a cobalt-containing surface. In some embodiments, the passivation film may be formed when a passivation agent forms a coordination bond with the copper, nickel or cobalt. For example, the passivation film may be formed on a substrate surface when a passivation agent forms a coordination complex with the copper (Cu), nickel (Ni) or cobalt (Co) on the substrate surface. In some embodiments, the passivation film may be a continuous or substantially continuous film. However, although generally referred to herein as a passivation film, in some embodiments, the passivation material may not form a complete, or uninterrupted film over the metal surface. For example in some embodiments a passivation film may cover only one or more portions of a metal surface, and not the entire metal surface. In some embodiments a passivation film may comprise one or more discontinuous areas of a passivation material on a metal surface. The passivation film referred to herein may comprise a material which can reduce or prevent further oxidation of the metal surface on which it is formed.

In some embodiments, a passivation agent may be a chemical that coordinates to copper, nickel or cobalt. In some embodiments the passivation agent may be a complexing agent that forms a coordination complex with copper nickel or cobalt. In some embodiments a passivation agent may comprise a hydrocarbon. In some embodiments, the passivation agent may comprise a cyclic hydrocarbon, for example an aromatic hydrocarbon.

In some embodiments, the passivation agent may comprise a carbon atom (C), a hydrogen atom (H) and a nitrogen atom (N) or sulfur atom (S). For example, the passivation agent may comprise a cyclic hydrocarbon comprising carbon, hydrogen and nitrogen. In some embodiments the passivation agent may comprise an aromatic hydrocarbon comprising carbon, hydrogen and nitrogen.

In some embodiments, the passivation agent may comprise a carbon atom, a hydrogen atom and a nitrogen atom. For example, the passivation agent may be a hydrocarbon comprising carbon, hydrogen and nitrogen. In some embodiments the passivation agent may comprise a carbon atom, a hydrogen atom and at least two nitrogen atoms. In some embodiments, the passivation agent can comprise at least three nitrogen atoms. For example, the passivation agent may comprise a carbon atom, a hydrogen atom and at least three nitrogen atoms.

In some embodiments, the passivation agent may comprise sulfur. For example, a passivation agent may comprise a carbon atom, a hydrogen atom and a sulfur atom.

In some embodiments, a passivation agent may form a coordination bond with copper, nickel or cobalt on a substrate surface through one or more nitrogen atoms. In some embodiments the passivation agent coordinates copper through at least one nitrogen atom and in some embodiments through at least two nitrogen atoms. For example, a passivation agent comprising carbon, hydrogen and two nitrogen atoms may coordinate with copper on a substrate surface through one of the nitrogen atoms, or both of the nitrogen atoms.

In some embodiments, the passivation agent for forming a passivation film on a copper surface may comprise benzotriazole (BTA).

Although discussed herein primarily in terms of BTA as a passivation agent on a Cu surface, unless indicated otherwise, other passivation agents as described herein can be substituted for BTA and Ni or Co surfaces may be substituted for the Cu surface.

In some embodiments, the passivation film may be formed on a copper surface (or Ni or Co) of the substrate, such as by exposure of the surface to BTA (or another passivation agent) during a chemical mechanical planarization process. In particular, in some embodiments a passivation film formed on a copper (or Ni or Co) surface due to exposure of the surface to BTA or another passivation agent can be removed using a vapor phase organic reactant.

In some embodiments, the vapor phase organic reactant comprises formic acid. For example, exposing the passivation film to vapor phase formic acid may result in formation of one or more volatile byproducts, thereby facilitating removal of the passivation film from the copper surface. In some embodiments, removing the passivation film comprises exposing the passivation film to a plurality of pulses of vapor phase formic acid.

A substrate surface may comprise copper, such as copper deposited on the substrate surface for electrical interconnect. In some embodiments the substrate surface may comprise Ni or Co. The substrate surface may also comprise one or more other materials, such as a dielectric material. For example, the substrate surface may comprise a low-k dielectric material (e.g., extreme low-k material (ELK), such as dielectric material having a dielectric constant (k) of about 2.3). Copper may be deposited over and/or within three-dimensional features on the substrate surface comprising the dielectric material to form the electrical interconnect.

Removal of copper (or Ni or Co) from a substrate surface can be achieved by using chemical mechanical planarization. As described herein, chemical mechanical planarization can include application of a slurry solution to a substrate surface using a polishing pad. A slurry solution can include chemical and mechanical components. For example, the slurry solution can include abrasive particles to facilitate mechanical removal, as well as chemical components to facilitate chemical removal of the substrate surface material. For example, slurry solutions can include pH adjusting agents, oxidizing agents, catalysts and corrosion inhibiting agents.

Corrosion inhibiting agents can facilitate desired planarization by reducing undesired isotropic etching, dishing, erosion and/or corrosion of substrate surface materials during and/or after the chemical mechanical planarization process. Benzotriazole (BTA) or another passivation agent can be included in slurry solutions, for example as a corrosion inhibiting agent. The passivation agent can interact with the copper (or Ni or Co) on the substrate surface to form a passivation film on the surface of the copper. Without being limited by any particular theory or mode of operation, benzotriazole or another passivation agent may form a coordination complex with copper (or Ni or Co) to form a copper-containing polymeric passivation film during processing. However, the passivation film can remain on the surface of a copper layer after chemical mechanical planarization is complete.

The presence of the passivation film after completion of chemical mechanical planarization can undesirably change one or more characteristics of the substrate surface, thereby adversely affecting one or more subsequent fabrication processes (e.g., a selective deposition process). Thus, it is desirable to clean the passivation film from the copper (or Ni or Co) surface so as to restore a cleaned copper surface, while maintaining one or more characteristics of one or more other materials on the substrate surface. For example, a substrate surface comprising elemental copper and a passivation film formed thereon may be subjected to the cleaning process to remove the passivation film from the copper surface such that the substrate copper surface is restored to the elemental copper state. In some embodiments, methods are provided for removal of the passivation film using a vapor phase reactant.

In some embodiments, methods described herein can be used to remove metal-containing particles from a substrate. In some embodiments, one or more vapor phase reactants described herein can be used to remove the metal-containing particles. The metal-containing particles may have a composition the same as or similar to a passivation film formed on the metal surface. For example, copper-containing particles may be generated during chemical mechanical planarization of a copper surface on a substrate. The copper-containing particles may be formed over various portions of the substrate surface, including over portions of the substrate surface which do not have copper. For example, copper-containing particles may be generated over dielectric material on the substrate surface while polishing the substrate. Without being limited by any particular theory or mode of operation, the vapor phase reactant may interact with the copper-containing particles to reduce a size of the particles and/or form one or more volatile byproducts such that the smaller particles and/or the volatile byproducts can be removed from the substrate surface. Removal of the particles from the substrate surface may further facilitate restoration of one or more properties of the substrate surface. In some embodiments, removal of the particles may provide desired removal of passivation material from the substrate surface, for example providing desired selectivity for the passivation material removal process. In some embodiments, methods described herein can remove all or substantially all metal-containing particles from the substrate surface. In some embodiments, more than about 50% of the metal-containing particles are removed, including greater than about 70%, or greater than about 90%.

In some embodiment, one or more substrate surface cleaning processes described herein can remove from a substrate surface metal-containing particles having a longest dimension of up to about 20 nm, up to about 10 nm, up to about 5 nm, or up to about 2 nm.

Although discussed herein primarily in terms of removal of passivation films, the substrate surface cleaning processes may also be applied to substrate surfaces for removal of metal-containing particles.

In some embodiments, a substrate comprising a passivation film on at least one surface, is contacted with a vapor phase reactant. The passivation film may have been formed by a chemical mechanical planarization process, such as by exposure to benzotriazole. In some embodiments a substrate comprising a copper film with a passivation film formed thereon is contacted with a vapor phase reactant. In some embodiments, the vapor phase organic reactant comprises a vapor phase organic reducing agent. For example, the substrate surface passivation film may be exposed to an organic vapor phase reducing agent. Without being limited by any particular theory or mode of operation, the vapor phase organic reducing agent may react with, for example reduce, one or more components of the passivation layer such that the passivation layer can be removed from the substrate surface, for example by formation of volatile byproducts which can be readily transported away from the substrate surface. Further without being limited by any particular theory or mode of operation, copper on the substrate surface which has been oxidized may be reduced by the vapor phase organic reducing agent. For example, the oxidized elemental copper may be reduced by the vapor phase organic reducing agent to a zero oxidation state such that elemental copper is restored. In some embodiments, although referred to herein as a reducing agent, the vapor phase organic reducing agent may facilitate removal of the passivation film without or substantially without effecting a reduction. The terms organic reducing agent or reducing agent do not limit the scope of the disclosure to processes in which a reduction is effected.

In some embodiments, a process for removing the passivation film can include a plurality of cycles. A cycle of the passivation film removal process may comprise contacting one or more vapor phase organic reactants with a desired substrate surface, for example a surface of the passivation film. In some embodiments, one or more parameters of a cycle can be different from that of another cycle. For example, selection of one or more vapor phase reactants, a vapor phase reactant flow rate, reaction chamber pressure, process temperature, and/or duration of the cycle, may be different from that of another cycle. In some embodiments, the removal process includes a plurality of cycles where each cycle has similar or the same process conditions as that of other cycles in the process.

Removing the passivation film can include removing part or all of the passivation film from a desired substrate surface. In some embodiments a passivation film is removed from the surface of a copper layer, while advantageously preserving surface characteristics of one or more other materials on the substrate surface. For example, one or more processes described herein can be used to restore a copper surface by removing a passivation layer from the copper surface without, or substantially without changing a surface chemistry of a dielectric material on the substrate surface. In some embodiments, exposure of the substrate surface to the organic reactant, such as formic acid, during the passivation film removal process can reduce an oxidation state of the substrate surface copper to an oxidation state of zero such that the copper is restored to an elemental copper state, providing an activated copper surface having desired catalytic activity for a subsequent fabrication process. For example, the copper surface may be activated by the passivation film removal process such that it has desired catalytic activity for a subsequent selective deposition process.

In some embodiments, one or more processes described herein do not comprise a plasma process. In some embodiments, one or more processes described herein comprise a thermal process. For example, one or more vapor phase organic reactants are not activated by a plasma source prior to their contact with the passivation film. In some embodiments, one or more processes described herein are free or substantially free of radicals. In some embodiments, a thermal process may provide removal of a passivation film from a copper surface while avoiding or substantially avoiding adversely affecting one or more characteristics of one or more other materials on the substrate surface, including one or more characteristics of a dielectric material (e.g., a low-k dielectric material on the substrate surface exposed to the thermal process), such that a subsequent selective deposition process can selectively deposit on the cleaned copper surface. In some embodiments, a thermal process may not significantly remove or alter hydrophobic functional groups from the surface of the one or more other materials on the substrate (e.g., —CH$_3$ groups on the surface of the low-k dielectric material), such that hydrophobicity of the one or more other materials is preserved or substantially preserved. In contrast, a plasma process may undesirably affect one or more characteristics of other materials on the substrate surface, such as the hydrophobicity of the materials (e.g., hydrophobicity of low-k dielectric materials by removal of —CH$_3$ groups from the surface of the low-k dielectric materials).

In some embodiments, the one or more other materials on the substrate surface can be pre-treated prior to exposing the substrate to the one or more vapor phase reactants for removing the passivation film from the substrate. In some embodiments, the one or more other materials on the substrate surface can be pre-treated to reduce or inhibit subsequent deposition of a conductive material on the material, such as deposition of a metal. For example, a dielectric material, such as a low-k dielectric material, can be pre-treated by contacting the dielectric material with one or more pre-treatment reactants in a thermal vapor phase process to form a protective material on the dielectric material. Forming the protective material on the dielectric material prior to removing the passivation film on the copper surface may facilitate desired pre-treatment of the dielectric material without undesirably affecting properties of the copper surface. Without being limited by any particular theory or mode of operation, a thermal process for removing the passivation film from the copper surface may not significantly affect one or more characteristics of the protective material formed on the dielectric material, thereby facilitating retaining desired properties of the protective material and thus providing desired subsequent selective deposition on the cleaned copper surface.

In some embodiments, the one or more pre-treatment reactants are not liquid phase pre-treatment reactants. In some embodiments, the one or more pre-treatment reactants are vapor phase pre-treatment reactants. In some embodiments, the protective film is not formed by self-assembled monolayers (SAM), for example hydrocarbons comprising long alkyl chains as a backbone, such as alkyl chains having a length of C4 or higher, or C6 or higher.

In some embodiments, the pre-treatment reactant is one or more of trimethylchlorosilane $(CH_3)_3SiCl$ (TMCS), trimethyldimethylaminosilane $(CH_3)_3SiN(CH_3)_2$ or another type of alkyl substituted silane having formula $R_{4-x}SiX_x$, wherein x is from 1 to 3, preferably x is 1, and each R can independently selected to be a C1-C5 hydrocarbon, such as methyl, ethyl, propyl or butyl, preferably methyl, and X is halide or X is another group capable of reacting with OH-groups, such as an alkylamino group —$NR_1R_2$, wherein each $R_1$ can be independently selected to be hydrogen or C1-C5 hydrocarbon, preferably methyl or ethyl, $R_2$ can be independently selected to be C1-C5 hydrocarbon, preferably methyl or ethyl, preferably X is chloride or dimethylamino. In some embodiments, the pre-treatment reactant can be a silane compound comprising at least one alkylamino group, such as bis(diethylamino)silane, or a silane compound comprising a $SiH_3$ group, or silazane, such hexamethyldisilazane (HMDS).

In some embodiments, selective deposition over the cleaned copper (or Ni or Co) surface can be performed after removal of the passivation film. For example, one or more materials may be selectively deposited onto the cleaned surface without depositing on one or more other, different materials on the substrate surface. As used herein, selective deposition of one or more materials over the cleaned copper surface comprises deposition of the one or more materials on and in direct contact with the cleaned copper surface while less deposition, or even no deposition, occurs on a different material on the substrate. In some embodiments, an electrically conductive material can be deposited on and in direct contact with the cleaned copper surface. In some embodiments, a metal can be selectively deposited on and in direct contact with the cleaned copper surface. In some embodiments, a noble metal can be selectively deposited on and in direct contact with the cleaned copper surface. In some embodiments, the metal can be selectively deposited on and in direct contact with the cleaned copper surface using an atomic layer deposition (ALD) process. For example, ALD type processes can be based on controlled, self-limiting surface reactions of vapor phase precursors in which gas phase reactions are avoided by alternately and sequentially contacting the substrate with the precursors by removing excess reactants and/or reactant byproducts from the reaction chamber between precursor pulses. In some embodiments, the ALD process for depositing the metal can include using a first precursor and a second precursor, where the first precursor comprises a metal precursor and the second precursor comprises a precursor which does not or substantially does not oxidize the cleaned copper surface.

In some embodiments, tungsten can be selectively deposited on and in direct contact with the cleaned copper surface. For example, the substrate surface may include a dielectric material such that tungsten can be selectively deposited over the cleaned copper surface, while no or substantially no tungsten is deposited on the dielectric material.

FIG. 1 shows an example of a substrate surface cleaning process 100 for removing a passivation film formed over a copper layer. In block 102, a substrate having a first surface comprising copper can be provided. For example, the substrate can be provided as part of an integrated circuit fabrication process. In block 104, the copper can be exposed to benzotriazole thereby forming a passivation film on the surface of the substrate. For example, the copper may be exposed to benzotriazole during a CMP process. In block 106, the passivation film can be contacted with a vapor phase organic reactant to remove the passivation film. For example, the vapor phase organic reactant can react with the passivation film to generate one or more volatile byproducts to facilitate removal of the passivation film. In some embodiments, a purge step can follow contacting the passivation film with the vapor phase organic reactant to remove excess reactants and/or reaction byproducts from the reaction chamber. In some embodiments, contacting the passivation film with the vapor phase organic reactant can be repeated a number of times. Contacting the passivation film with the vapor phase organic reactant may be repeated a plurality of times to facilitate desired removal of the passivation film, and provide a cleaned copper surface. For example, a substrate surface cleaning process may include a plurality of cycles, where each cycle includes contacting the passivation film with a vapor phase organic reactant. In some embodiments, at least one of the plurality of cycles comprises a purge step. For example, some cycles may not include a purge step. In some embodiments, each cycle comprises a purge step.

In some embodiments, contacting the passivation film with the vapor phase organic reactant is not repeated. For example, the substrate surface cleaning process may include a single continuous or substantially continuous duration in which the passivation film is exposed to the organic reactant.

In some embodiments, a substrate surface cleaning process can be performed in a batch reaction chamber. In some embodiments, a substrate surface cleaning process can be performed in a single-wafer reaction chamber. Exemplary single wafer reactors are commercially available from ASM America, Inc. (Phoenix, Ariz.) under the tradenames Pulsar® 2000 and Pulsar® 3000 and ASM Japan K.K (Tokyo, Japan) under the tradename Eagle® XP and XP8. Exemplary batch ALD reactors are commercially available from and ASM Europe B.V (Almere, Netherlands) under the tradenames A400™ and A412™.

In some embodiments, a vapor phase organic reactant can be selected based on its ability to react with and remove the passivation film under desired conditions, such as by reacting with the film to form volatile byproducts. In some embodiments, the vapor phase organic reactant can demonstrate thermal stability within a range of process temperatures. For example, the vapor phase organic reactant may be thermally stable across a desired range of process temperatures such that growth-disturbing condensable phases do not form on the substrate and/or the vapor phase organic reactant does not generate harmful levels of impurities on the substrate surface through thermal decomposition. In some embodiments, the vapor phase organic reactant can exhibit sufficient vapor pressure such that a desired quantity of chemical molecules is present in the gas phase near the substrate surface to enable the reduction reactions.

In some embodiments, a vapor phase organic reactant may be selected based on its ability to decompose into two or more reactive components, at least one of which can react with the passivation film to form a volatile byproduct. For example, the vapor phase organic reactant may desirably decompose under process conditions of one or more cycles of the substrate surface clean process such that one or more of the reactive components generated by the decomposition process may react with the passivation film. In some embodiments, both one or more of the decomposed parts and the vapor phase organic reactant itself can react with passivation film.

In some embodiments, the vapor phase reactant comprises an organic reactant, such as formic acid. In some embodiments, the vapor phase reactant comprises acetic acid ($CH_3COOH$) and/or propanoic acid ($CH_3CH_2COOH$). In some embodiments, the organic reactant can include an alcohol. In some embodiments, the organic reactant can include an aldehyde. In some embodiments, the organic reactant can have at least one functional group selected from the group consisting of alcohol (—OH), aldehyde (—CHO), and carboxylic acid (—COOH).

Without being limited by any particular theory or mode of operation, the process for eroding and/or removing the passivation film can include reducing one or more components of the passivation film by using the organic reactant, such that at least a portion of the passivation film can be removed from the substrate surface. As described herein, the vapor phase reactant gas comprises an organic acid, including a carboxylic acid. Reaction between the passivation film and the carboxylic acid can generate one or more volatile byproducts which can be readily transported away from the substrate surface and removed from the reaction space. For example, the carboxylic acid may reduce oxidized copper forming part of the passivation film such that the oxidized copper may be restored to its elemental state.

In some embodiments, eroding and/or removing the passivation film may not comprise reducing one or more components of the passivation film. For example, the organic reactant may interact with one or more components of the passivation film to erode and/or remove the film without or substantially without reducing any components of the passivation film.

Reactants containing at least one alcohol group are preferably selected from the group consisting of primary alcohols, secondary alcohols, tertiary alcohols, polyhydroxy alcohols, cyclic alcohols, aromatic alcohols, and other derivatives of alcohols.

Preferred primary alcohols have an —OH group attached to a carbon atom which is bonded to another carbon atom, in particular primary alcohols according to the general formula (I):

$$R^1\text{—OH} \qquad (I)$$

wherein $R^1$ is a linear or branched $C_1$-$C_{20}$ alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

$$\underset{R^1\text{—CH—}R^1}{\overset{\text{OH}}{|}} \qquad (II)$$

wherein each $R^1$ is selected independently from the group of linear or branched $C_1$-$C_{20}$ alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

$$\underset{\underset{R^1}{|}}{\overset{\text{OH}}{\underset{|}{R^1\text{—C—}R^1}}} \qquad (III)$$

wherein each $R^1$ is selected independently from the group of linear or branched $C_1$-$C_{20}$ alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5-6 carbon atoms.

Preferred aromatic alcohols have at least one —OH group attached either to a benzene ring or to a carbon atom in a side chain.

Preferred reactants containing at least one aldehyde group (—CHO) are selected from the group consisting of compounds having the general formula (V), alkanedial compounds having the general formula (VI), and other derivatives of aldehydes.

Thus, in one embodiment preferred reactants are aldehydes having the general formula (V):

$$R^3\text{—CHO} \qquad (V)$$

wherein $R^3$ is selected from the group consisting of hydrogen and linear or branched $C_1$-$C_{20}$ alkyl and alkenyl groups, preferably methyl, ethyl, propyl, butyl, pentyl or hexyl. More preferably, $R^3$ is selected from the group consisting of methyl or ethyl. Examples of preferred compounds according to formula (V) are formaldehyde, acetaldehyde and butyraldehyde.

In another embodiment preferred reactants are aldehydes having the general formula (VI):

$$\text{OHC—}R^4\text{—CHO} \qquad (VI)$$

wherein $R^4$ is a linear or branched $C_1$-$C_{20}$ saturated or unsaturated hydrocarbon. Alternatively, the aldehyde groups may be directly bonded to each other ($R^4$ is null).

Preferred reactants containing at least one —COOH group are preferably selected from the group consisting of compounds of the general formula (VII), polycarboxylic acids, and other derivatives of carboxylic acids.

Thus, in one embodiment preferred reactants are carboxylic acids having the general formula (VII):

$$R^5\text{—COOH} \qquad (VII)$$

wherein $R^5$ is hydrogen or linear or branched $C_1$-$C_{20}$ alkyl or alkenyl group, preferably methyl, ethyl, propyl, butyl, pentyl or hexyl, more preferably methyl or ethyl. In some embodiments, $R^5$ is a linear or branched $C_1$-$C_3$ alkyl or alkenyl group. Examples of preferred compounds according to formula (VII) are formic acid, propanoic acid and acetic acid, most preferably formic acid (HCOOH).

In some embodiments, the reactant demonstrates desired vapor pressure such that the reactant can be volatized without heating the reactant. In some embodiments, such a reactant comprises only one carboxyl group (—COOH). In some embodiments, such a reactant is not a dicarboxylic acid. In some embodiments, such a reactant is not a citric acid.

In some embodiments, the reactant can be heated to volatize the reactant prior to delivering the volatized reactant to the substrate surface. In some embodiments, such a reactant comprises a dicarboxylic acid, including an oxalic acid.

In some embodiments, the reactant comprises less than about 15 weight % water ($H_2O$). Preferably, the reactant comprises less than about 5 weight % water, more preferably less than about 2 weight %, and most preferably less than about 1 weight %. For example, the reactant may comprise less than about 0.5 weight % water.

As described herein, a reactant may decompose into two or more reactive components during the substrate surface clean process. For example, some of the carboxylic acid delivered to a reaction space may decompose into carbon monoxide (CO) and hydrogen gas ($H_2$) during the substrate surface clean process, such that one or more of the carbon monoxide (CO), hydrogen gas ($H_2$) and/or an undecomposed carboxylic acid reacts with the passivation film to facilitate removal of the film. In this way a substrate surface may be exposed to hydrogen gas ($H_2$) even though no hydrogen gas ($H_2$) is actively provided into the reaction space from an external source.

In some embodiments, the vapor phase organic reactant may be stored in a liquid phase and subsequently volatized prior to being delivered to the substrate surface. In some embodiments, the vapor phase organic reactant is in vapor phase in the reaction space such that the reaction space is free or substantially free of any liquid phase reactants. For example, the vapor phase organic reactant may be in liquid phase during storage and may be subsequently volatized prior to delivery into a reaction chamber such that only or substantially only organic reactant in the vapor phase is present within the reaction chamber.

In some embodiments, a vapor phase reactant may be stored in a gas bubbler and can be supplied to the reaction chamber from the gas bubbler. In some embodiments, the vapor phase reactant can be stored in a gas bubbler at around room temperature (e.g., from about 20° C. to about 25° C.). For example, the vapor phase reactant gas may be pulsed into the reaction chamber from the gas bubbler during a cycle of the substrate surface cleaning process. In some embodiments, a mass flow rate of the vapor phase reactant may be controlled by controlling the extent to which a valve for delivering the vapor phase reactant into the reactor chamber is kept open (e.g., a needle valve). For example, a mass flow rate may be selected such that a quantity of the vapor phase reactant may be flowed into the reaction chamber during a cycle of the cleaning process to facilitate desired removal of the passivation film during the cycle.

In some embodiments, a vapor phase reactant pulse can have a duration of about 0.5 second (s) to about 60 s, about 1 s to about 20 s, or about 1 s to about 10 s. A duration of a cycle can be selected to provide desired quantity of the vapor phase reactant into the reaction space. In some embodiments, a vapor phase reactant pulse comprises a duration of about 1 s. For example, a cycle of the substrate surface cleaning process comprises flowing formic acid (HCOOH) into the reaction space for a duration of about 1 s.

In some embodiments, a cycle of the substrate surface cleaning process comprises flowing carrier gas into the reaction space. For example, the carrier gas may be flowed during a vapor phase reactant pulse. The carrier gas may comprise one or more inert gases. In some embodiments, the carrier gas comprises one or more of nitrogen gas ($N_2$), argon (Ar), and helium (He). For example, the carrier gas may facilitate transport of the vapor phase reactants to the substrate surface and/or transport away from the substrate surface one or more byproducts generated by the reaction between the vapor phase reactants and the substrate surface passivation film. In some embodiments, the carrier gas can facilitate reaction between the one or more vapor phase reactants and the substrate surface passivation film without or substantially without itself reacting with the passivation film. In some embodiments, a carrier gas may be flowed through a gas bubbler for storing the vapor phase reactant prior to being delivered to the reaction chamber to facilitate delivery of the vapor phase reactant to the reaction chamber.

In some embodiments, a cycle of the substrate surface cleaning process may not include actively flowing hydrogen gas ($H_2$) into the reaction space. For example, hydrogen gas may be generated within the reaction space due to one or more reactions occurring in the reaction space even though hydrogen gas is not actively provided into the reaction space from an external source.

In some embodiments, a substrate surface cleaning process can include multiple distinct durations in which the passivation film is exposed to one or more vapor phase reactants. For example, the substrate surface cleaning process may include exposing the passivation film to a plurality of vapor phase reactant pulses. In some embodiments, a substrate surface cleaning process can include one single continuous or substantially continuous duration in which the passivation film is exposed to one or more vapor phase reactants. For example, the substrate surface cleaning process may include exposing the passivation film to a single vapor phase reactant pulse. For example, a duration of the single vapor phase reactant pulse may be selected to remove all or substantially all of the passivation film.

In some embodiments, exposing the passivation film to one or more vapor phase reactants can be followed by an interval in which the one or more vapor phase reactants are not actively provided into the reaction chamber. For example, the substrate may be transported from the reaction space to a space in which it is not exposed or substantially not exposed to the one or more vapor phase reactants during the interval. In some embodiments, a purge step can be performed during the interval to facilitate removal of one or more excess reactants and/or reaction byproducts from the reaction chamber. A purge step may include flow of inert gas through the reaction chamber and/or evacuation of the reaction chamber (e.g., by drawing a vacuum upon the reaction chamber), to facilitate removal of excess reactants and/or reaction byproducts. In some embodiments, both transport of the substrate and the purge step can be performed during an interval. In some embodiments, the substrate is not transported and remains in the reaction space during the purge step.

In some embodiments, an interval follows each period of exposing the passivation film to the one or more vapor phase reactants. In some embodiments, a purge step and/or transport of the substrate follow each exposure of the passivation film to the one or more vapor phase reactants. For example, subsequent to each exposure of the substrate to the vapor phase reactant(s) in each cycle, the substrate may be moved to a space free or substantially free of the vapor phase reactants, or the reaction chamber may be purged of excess reactants and/or reaction byproducts. In some embodiments, the purge step comprises continuing flow of the carrier gas (e.g., continuing flow of the carrier gas, such as at least one component of a multi-component carrier gas, at a same or different flow rate as compared to that during the reactant pulse). For example, a substrate surface cleaning process may include continuously flowing the carrier gas while periodically flowing the one or more vapor phase reactants. For example, the substrate surface cleaning process may include continuous flow of nitrogen gas ($N_2$) while periodically flowing vapor phase formic acid.

In some embodiments, an interval following a contacting the passivation film with one or more vapor phase reactants for cleaning the substrate surface can have a duration of about 1 s to about 360 s, including about is to about 120 s, including about 1 s to about 60 s. In some embodiments, a purge step can be performed for the duration of the interval. For example, a purge step can have a duration of about 1 s to about 360 s, including about 1 s to about 120 s, including about 1 s to about 60 s. In some embodiments, a purge step after contacting the passivation film with one or more vapor phase reactants can have a duration of about 30 s, about 20 s, or about 10 s. In some embodiments, one or more parameters of a purge step can be different from that of another purge step in a substrate surface cleaning process comprising a plurality of purge steps. For example, one or more purge steps between two reactant pulses may have a duration shorter than that of a purge step following a last reactant pulse of the substrate surface clean process. For example, one or more purge steps between two reactant pulses may have an inert gas flow rate lower than that of a purge step following a last reactant pulse. In some embodiments, a substrate surface cleaning process may include one or more intervals in which a purge step is not performed. For example, a purge step may be performed following only some reactant pulses of a substrate surface clean process.

Flow rate of one or more inert gases during a purge step can be selected to provide desired purging of the reaction chamber. In some embodiments, the purge step can include flow of up to about 2,000 standard cubic centimeters per minute (sccm) of an inert gas, including about 50 sccm to about 1,500 sccm, or about 100 sccm to about 1,000 sccm. For example, a purge step may comprise flow of nitrogen gas ($N_2$) at 1000 sccm for a duration of about 10 s.

In some embodiments, the substrate surface cleaning process does not include an interval between two reactant pulses. For example, the process may include exposing the substrate surface to a single reactant pulse configured to provide the desired amount of reactants to the substrate surface.

In some embodiments, a cycle of the substrate surface cleaning process can be performed at a process temperature of about 50° C. to about 500° C., preferably from about 100° C. to about 400° C., and more preferably from about 150° C. to about 350° C. For example, the process temperature may be about 200° C. to about 300° C. The process temperature as referred to herein can comprise a temperature of a reaction chamber susceptor, a reaction chamber wall, and/or a temperature of the substrate itself. For example, a temperature of the substrate may be selected to facilitate reaction between the substrate surface passivation film and the one or more vapor phase reactants, and/or facilitate generation of volatile byproducts during each cycle of the substrate surface clean process, while maintaining the substrate at a temperature to reduce or avoid overheating of the substrate and/or damage to one or more substrate features. In some embodiments, a process temperature of a cycle of the substrate surface cleaning process can be about 200° C. to about 250° C. For example, the substrate may be heated to a temperature of about 200° C. to about 250° C. during one or more cycles of the substrate surface clean process.

In some embodiments, the pressure of the reactor chamber during processing is maintained at about 0.01 Torr to about 760 Torr, preferably from about 0.1 Torr to about 50 Torr, and more preferably about 0.1 Torr to about 10 Torr. In some embodiments, a cycle of the substrate surface cleaning process can be performed with a reaction chamber pressure of about 0.5 Torr to about 3 Torr. For example, the chamber pressure may be about 1 Torr to about 2 Torr, including about 1.5 Torr. The selected reaction chamber pressure may serve to facilitate desired removal of the passivation film.

As described herein, a substrate surface cleaning process can include a plurality of cycles comprising exposing a surface passivation film to one or more vapor phase reactants. A number of cycles of the substrate surface cleaning process may be selected to facilitate desired removal of the passivation film. In some embodiments, a number of cycles of the substrate surface cleaning process may depend on one or more parameters of the substrate surface cleaning process. For example, a number of cycles may depend on a process temperature of one or more cycles of the process, for example, a relatively lower number of cycles may be selected for a process which includes one or more cycles comprising a relatively higher process temperature. In some embodiments, the substrate surface cleaning process comprises up to about 100 cycles, including up to about 50 cycles. In some embodiments, the process comprises about 10 cycles. In some embodiments, a total number of cycles, and/or process conditions of one or more cycles of the process, can be selected to achieve complete removal of the passivation film, without or substantially without damaging the copper.

In some embodiments, one or more parameters of a cycle of a substrate surface cleaning process can be different from that of another cycle. For example, selection of one or more vapor phase reactants, a vapor phase reactant flow rate, chamber pressure, process temperature, and/or duration of the cycle, may be different from that of another cycle. In some embodiments, the cleaning process includes a plurality of cycles, each cycle having similar or the same process conditions as that of other cycles in the process.

Figure 2:
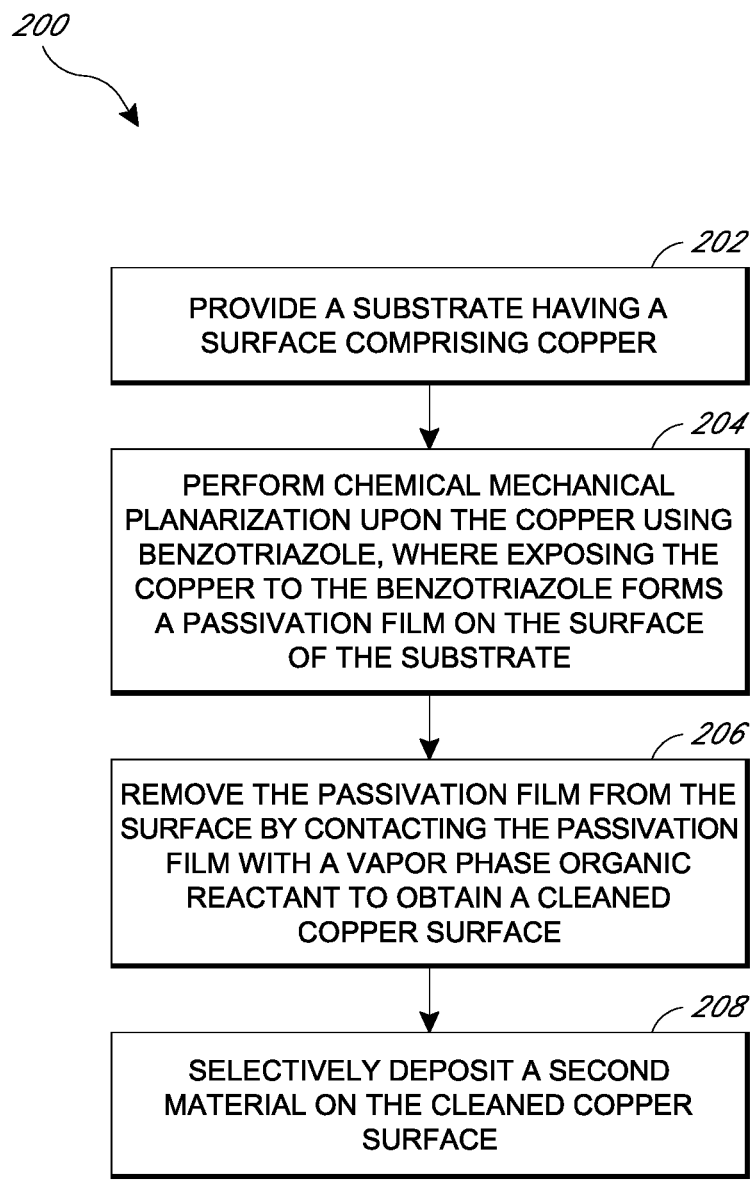
FIG. 2 shows another example of a substrate surface cleaning process for removing a passivation film formed over a copper layer.

Referring to FIG. 2, another example of a substrate surface cleaning process 200 is shown for removing a passivation film, such as a passivation film formed over a copper layer. In block 202, a substrate having a surface comprising copper can be provided. In block 204, chemical mechanical planarization can be performed upon the copper using benzotriazole, where exposing the copper to the benzotriazole forms a passivation film on the surface of the substrate. In block 206, the passivation film can be removed from the surface by contacting the passivation film with a vapor phase organic reactant to obtain a cleaned copper surface. In block 208, a second material can be selectively deposited on the cleaned copper surface. For example, the second material may be deposited on the cleaned surface of the copper layer without or substantially without depositing on one or more other materials on the substrate surface. In some embodiments, tungsten can be selectively deposited on the cleaned copper surface.

In some embodiments, a substrate comprising a passivation film formed on a surface can be subjected to a surface cleaning process. The substrate surface can include a dielectric material (e.g., a dielectric material having a k value of about 2.3, or an extreme low-k material (ELK 2.3 dielectric material)). The surface cleaning process can include contacting the passivation film with one or more pulses of vapor phase formic acid. In some embodiments the surface cleaning process can include 10 repetitions of contacting the passivation film with formic acid, where each repetition can have a duration of about 10 s. For example, the formic acid can be supplied to the reaction chamber for the duration of each repetition. The formic acid can be maintained in a gas bubbler at around room temperature (e.g., at a temperature of about 20° C. to about 25° C.) and provided to the reaction chamber from the gas bubbler during each cycle of the cleaning process. A process temperature for each of the cycles can be about 200° C. to about 250° C. For example, a temperature of the substrate was maintained at a temperature of about 200° C. during each of the cycles. Each cycle of the cleaning process had a chamber pressure of about 0.5 Torr to about 3 Torr. A purge step can be performed following each repetition of contacting the passivation film with formic acid. According to some embodiments, a tungsten film can be subsequently selectively deposited directly onto the cleaned copper surface. No or substantially no tungsten was deposited on the dielectric material on the substrate surface.

As described herein, one or more processes described herein can facilitate desired removal of the passivation film while preserving one or more characteristics of one or more other materials on the substrate surface. In some embodiments, surface characteristics of the materials on the substrate surface can be analyzed using contact angle measurements. For example, contact angle analysis can be used to analyze surface chemistry of one or more materials on the substrate surface. Contact angle analysis of a substrate surface can be measured both prior to and subsequent to performing a substrate surface cleaning process such that characteristics of the surface before initiating the substrate surface cleaning process can be compared with characteristics of the substrate surface after completion of the substrate surface cleaning process. In some embodiments, water contact angle analysis can indicate change or preservation of a surface chemistry. Contact angle analysis can measure wettability of the surface of a material. In some embodiments, water can be used as a probing liquid for water contact angle measurements to determine the hydrophobicity or hydrophilicity of the material surface. The angle at which a water and vapor (e.g., air) interface meets the material surface can be measured. For example, contact angle can decrease as tendency of a drop of water to spread out over a surface increases, providing an inverse measure of wettability of the surface. A contact angle of less than about 90° can indicate a surface favorable to being wetted (e.g., hydrophilic) and a contact angle greater than 90° can indicate that the surface is not favorable to being wetted (e.g., hydrophobic). For example, a copper surface, such as a clean copper surface free or substantially free of a passivation film, can be hydrophilic (e.g., demonstrating a water contact angle of less than about 90°), and a low-k dielectric surface can be hydrophobic (e.g., demonstrating a water contact angle of greater than 90°). In some embodiments, the sessile drop technique can applied to determine water contact angle measurements for a surface, for example using a contact angle goniometer.

Example

A substrate comprising a passivation film formed on a surface was subjected to a surface cleaning process, according to one or more embodiments described herein. The passivation film was formed over a copper layer on a surface, due to reaction of the copper layer and benzotriazole. The substrate surface also included a dielectric material (e.g., a dielectric material having a k value of about 2.3, or an extreme low-k material (ELK 2.3 dielectric material)). The cleaning process facilitated removal of the passivation film such that a cleaned copper surface was provided. The cleaned copper surface comprised restored elemental copper. The surface cleaning process included 10 repetitions of contacting the passivation film with a vapor phase reactant, where each repetition had a duration of about 10 s. A purge step was performed following each repetition of contacting the passivation film with a vapor phase reactant. The vapor phase reactant of the surface clean process included formic acid. For example, vapor phase formic acid was flowed into the reaction chamber during each of the repetitions. The formic acid was maintained in a gas bubbler at around room temperature (e.g., at a temperature of about 20° C. to about 25° C.) and was provided to the reaction chamber from the gas bubbler. For example, a supply valve for providing the formic acid into the reaction chamber was kept open to an extent to facilitate desired supply of the formic acid. Vapor phase formic acid was provided from the gas bubbler into the reaction chamber for the duration of each repetition. A process temperature for each of the repetition was about 200° C. For example, a temperature of the substrate was maintained at a temperature of about 200° C. during each of the repetitions. Each repetition of the cleaning process had a chamber pressure of about 0.5 Torr to about 3 Torr, for example about 1.5 Torr.

The substrate comprising the cleaned copper surface was subsequently subjected to a selective deposition process. A tungsten film was subsequently selectively deposited directly onto the cleaned copper surface. No or substantially no tungsten was deposited on the dielectric material on the substrate surface.

Water contact angle analyses were performed on surfaces of the passivation film, the cleaned copper surface (e.g., after removal of the passivation film), and the dielectric material prior to and subsequent to the surface cleaning process. Water contact angle of the passivation film was measured prior to the surface cleaning process and was determined to be about 90°, indicating for example that the surface of the passivation film is hydrophobic. Water contact angle of the cleaned copper substrate surface was measured after completion of the surface cleaning process (e.g., water contact angle of the surface over which the passivation film was previously present) was measured and was determined to be about 30°, indicating a change of the surface from being hydrophobic to being hydrophilic after the surface cleaning process. Water contact angle of a surface of the dielectric film on the substrate surface was measured prior to initiating the substrate surface cleaning process and was determined to be above about 90°. Water contact angle of a surface of the dielectric film was measured after completion of the 10-cycle substrate surface cleaning process and was determined to be above 90°, remaining unchanged or substantially unchanged from the value measured prior to the start of the substrate cleaning process. Without being limited by any particular theory or mode of operation, the water contact angle analysis of the passivation film, the cleaned copper surface, and the dielectric material can indicate that the cleaning process facilitated desired removal of the passivation film, restoring a surface chemistry of the copper layer, while maintaining the surface chemistry of the dielectric material on the substrate. Maintaining the surface chemistry of the substrate surface may advantageously facilitate subsequent processing of the substrate, including for example, selective deposition onto the cleaned copper substrate surface.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

What is claimed is:

1. A method of removing copper-containing particles from a dielectric substrate surface comprising copper-containing particles, the method comprising:
   contacting the dielectric substrate surface comprising copper-containing particles with a plurality of pulses of a vapor phase organic reactant at a pressure of 0.1 to 50 Torr without exposing the substrate to a plasma, wherein the vapor phase organic reactant interacts with the copper-containing particles to reduce a size of the copper-containing particles and form one or more volatile byproducts, and
   removing volatile byproducts from the dielectric substrate surface.

2. The method of claim 1, wherein the substrate comprises a copper surface that has been subject to chemical mechanical polishing prior to contacting the dielectric substrate surface with the vapor phase organic reactant.

3. The method of claim 2, wherein the chemical mechanical polishing comprises exposing the copper surface to benzotriazole.

4. The method of claim 1, wherein volatile byproducts are removed from the dielectric surface by purging with an inert gas.

5. The method of claim 1, wherein more than 70% of the copper-containing particles that were present on the dielectric substrate surface are removed from the dielectric substrate surface when the dielectric substrate surface comprising copper-containing particles is contacted with the plurality of pulses of the vapor phase organic reactant.

6. The method of claim 1, wherein the vapor phase organic reactant is an alcohol, an aldehyde, or has the formula R—COOH, where R is hydrogen or a C1 to C3 alkyl.

7. The method of claim 1, wherein the vapor phase organic reactant comprises a carboxylic acid.

8. The method of claim 1, wherein the vapor phase organic reactant comprises formic acid.

9. The method of claim 1, wherein the dielectric substrate surface is contacted with the vapor phase organic reactant at a temperature of 100° C. to 400° C.

10. The method of claim 1, wherein the copper-containing particles have a longest dimension of up to 20 nm.

11. The method of claim 1, wherein the copper-containing particles form a passivation layer on the dielectric substrate surface prior to contacting the dielectric substrate surface with the vapor-phase organic reactant.

12. A method for removing at least a portion of a passivation film comprising copper-containing particles from a dielectric substrate surface, the method comprising:
exposing the passivation film to a plurality of pulses of a vapor phase organic reactant comprising an alcohol, an aldehyde or having the formula R—COOH, where R is hydrogen or a C1 to C3 alkyl at a pressure of 0.1 Torr to 50 Torr,
wherein the passivation film was formed on the dielectric substrate surface by subjecting a copper surface on the substrate to chemical mechanical polishing,
wherein the passivation film is not exposed to a plasma during exposure of the passivation film to the vapor phase organic reactant, and
wherein the vapor phase organic reactant interacts with the copper-containing particles to reduce a size of the copper-containing particles and form volatile reaction byproducts; and
removing volatile reaction byproducts from the dielectric substrate surface.

13. The method of claim 12, wherein the passivation film is exposed to the vapor phase organic reactant at a temperature of 100° C. to 400° C.

14. The method of claim 12, wherein the vapor phase organic reactant comprises carboxylic acid.

15. The method of claim 12, wherein the vapor phase organic reactant comprises formic acid.

16. The method of claim 12, wherein the passivation film is exposed to the vapor phase organic reactant in a plurality of cycles.

17. The method of claim 16, wherein the passivation film is exposed to the vapor phase organic reactant at least 10 times.

18. The method of claim 12, wherein removing comprises purging with an inert gas.

19. The method of claim 12, wherein the copper-containing particles have a longest dimension of up to 20 nm.

20. The method of claim 12, wherein chemical mechanical polishing comprises exposing the copper surface to benzotriazole.

* * * * *